United States Patent
Brashers et al.

(10) Patent No.: US 8,897,017 B2
(45) Date of Patent: Nov. 25, 2014

(54) SERVICEABLE HARD DISK DRIVE TRAYS FOR A SERVER RACK

(75) Inventors: Per Brashers, Oakland, CA (US); Jon Brian Ehlen, Milpitas, CA (US); John Thomas Kenevey, Saratoga, CA (US)

(73) Assignee: Facebook, Inc., Menlo Park, CA (US)

( * ) Notice: Subject to any disclaimer, the term of this patent is extended or adjusted under 35 U.S.C. 154(b) by 306 days.

(21) Appl. No.: 13/526,272

(22) Filed: Jun. 18, 2012

(65) Prior Publication Data

US 2013/0335913 A1 Dec. 19, 2013

(51) Int. Cl.
*H05K 7/14* (2006.01)

(52) U.S. Cl.
USPC ...... 361/725; 361/724; 312/223.1; 312/223.2

(58) Field of Classification Search
CPC ......... H05K 7/02; H05K 7/14; H05K 7/1421; H05K 7/1474; H05K 7/18; H05K 7/183; H05K 7/186
USPC .......................................................... 361/727
See application file for complete search history.

(56) References Cited

U.S. PATENT DOCUMENTS

| | | | | |
|---|---|---|---|---|
| 3,356,432 A | * | 12/1967 | Mariotte et al. | 312/323 |
| 5,169,221 A | * | 12/1992 | Wheeler | 312/323 |
| 6,193,341 B1 | * | 2/2001 | Eizadkhah et al. | 312/323 |
| 6,388,876 B1 | * | 5/2002 | Chen | 361/679.33 |
| 6,788,544 B1 | * | 9/2004 | Barsun et al. | 361/727 |
| 6,930,887 B2 | * | 8/2005 | Hartman | 361/727 |
| 6,956,735 B2 | * | 10/2005 | Lee et al. | 361/679.06 |
| 7,894,194 B2 | * | 2/2011 | Shih et al. | 361/725 |
| 8,537,533 B2 | * | 9/2013 | Sung | 361/679.28 |
| 2008/0106871 A1 | * | 5/2008 | James | 361/727 |

* cited by examiner

*Primary Examiner* — Anthony Q Edwards
(74) *Attorney, Agent, or Firm* — Fenwick & West LLP

(57) ABSTRACT

A sliding mechanism and a swivel mechanism allow a user to quickly and safely access components of a computing system, such as hard disk drives, included in a chassis. A housing affixed to the chassis includes a tray, which is coupled to the housing by the sliding mechanism. The swivel mechanism also couples the tray to the housing and allows the tray to be pivoted about the swivel mechanism. For example, the tray may be extended out of the housing via the sliding mechanism, and the portion of the tray extending from the housing may be pivoted using the swivel mechanism to simplify access to components coupled to the tray.

20 Claims, 3 Drawing Sheets

SERVICEABLE HARD DISK DRIVE TRAYS FOR A SERVER RACK

BACKGROUND

This invention relates generally to rack-mounted computing equipment, and in particular to sliding and locking computing device trays within a server rack.

Conventionally, computing device trays are mounted to a server rack using screws or a similar type of fastener. Hence, installing or removing a tray from a server rack typically involves screwing or unscrewing the tray to the serve rack. While trays may be installed using rails that are screwed into the exterior side of the tray and interior of the rack, installation and removal of trays from a server rack is often time-consuming and cumbersome. With large numbers of servers in a typical data center, significant time may be consumed in installing and removing components from various server racks. Installation and removal of trays may also cause significant expenses if a technician is paid for the installation or removal.

Additionally, many conventional server racks are over seven feet tall. Thus, two or more technicians and multiple pieces of equipment may be needed to install or remove trays from high locations on the racks, further increasing expenses for modifying server rack components. Additionally, trays are generally heavy and may pose a safety risk during installation or removal. Hence, modification of conventional components in existing server racks may be expensive and potentially dangerous.

SUMMARY

To simplify installation and/or removal of hard disk drives (HDDs) and other components from server racks, embodiments of the invention provide a simplified mechanism for accessing components of a computing system mounted in a chassis, such as a sever rack. A housing is configured to be enclosed by the chassis and affixed within the chassis, such as by being mounted to a rack included in the chassis. A tray is enclosed by the housing and coupled to the housing by a sliding mechanism. For example, an interior side of the housing is coupled to an exterior side of the tray by the sliding mechanism. The tray is movable along the sliding mechanism. A swivel mechanism is coupled to the tray and to the housing and is configured to allow the tray to pivot about the swivel mechanism. For example, the swivel mechanism is located at an end of the housing near exposed face (or opening), so when the tray is moved along the sliding mechanism, a portion of the tray protrudes from the exposed face and the portion of the tray may be pivoted about the swivel mechanism so a top surface of the tray moves in a direction towards the plane including the exposed face. This allows the tray to be reoriented to simplify access to components, such as hard disk drives, coupled to the tray.

In another embodiment, the housing is enclosed by and affixed to a chassis, while a sub-tray is enclosed by the housing. A sliding mechanism couples the sub-tray to the housing. For example, the sliding mechanism couples an exterior side of sub-tray to an interior side of the housing. The sub-tray is configured to be attached to various components of a computing system, such as one or more fans and a power distribution circuit. A component tray is configured to be coupled to one or more hard disk drives or other computing resources, and the component tray is coupled to the sub-tray configured to be enclosed by the chassis and affixed to the chassis. A swivel mechanism is coupled to the sub-tray and to the component tray, allowing the component tray to be rotated using the swivel mechanism as a pivot. Hence, the sub-tray may be moved along the sliding mechanism until a portion of the sub-tray protrudes from an opening, or exposed face, of the housing, and the component tray may be repositioned using the sliding mechanism to simplify access to the computing resources, such as by being repositioned about the swivel mechanism so that a top surface of the component tray moves in a direction toward the plane including the exposed face.

The Figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

A variety of electronic and computing devices or components require a retention mechanism for use in computer systems, such as in server assemblies, server racks, hard-drive arrays, personal computers, or any other computer system where electronic or computer devices must be secured and removed on a chassis.

Figure 1:
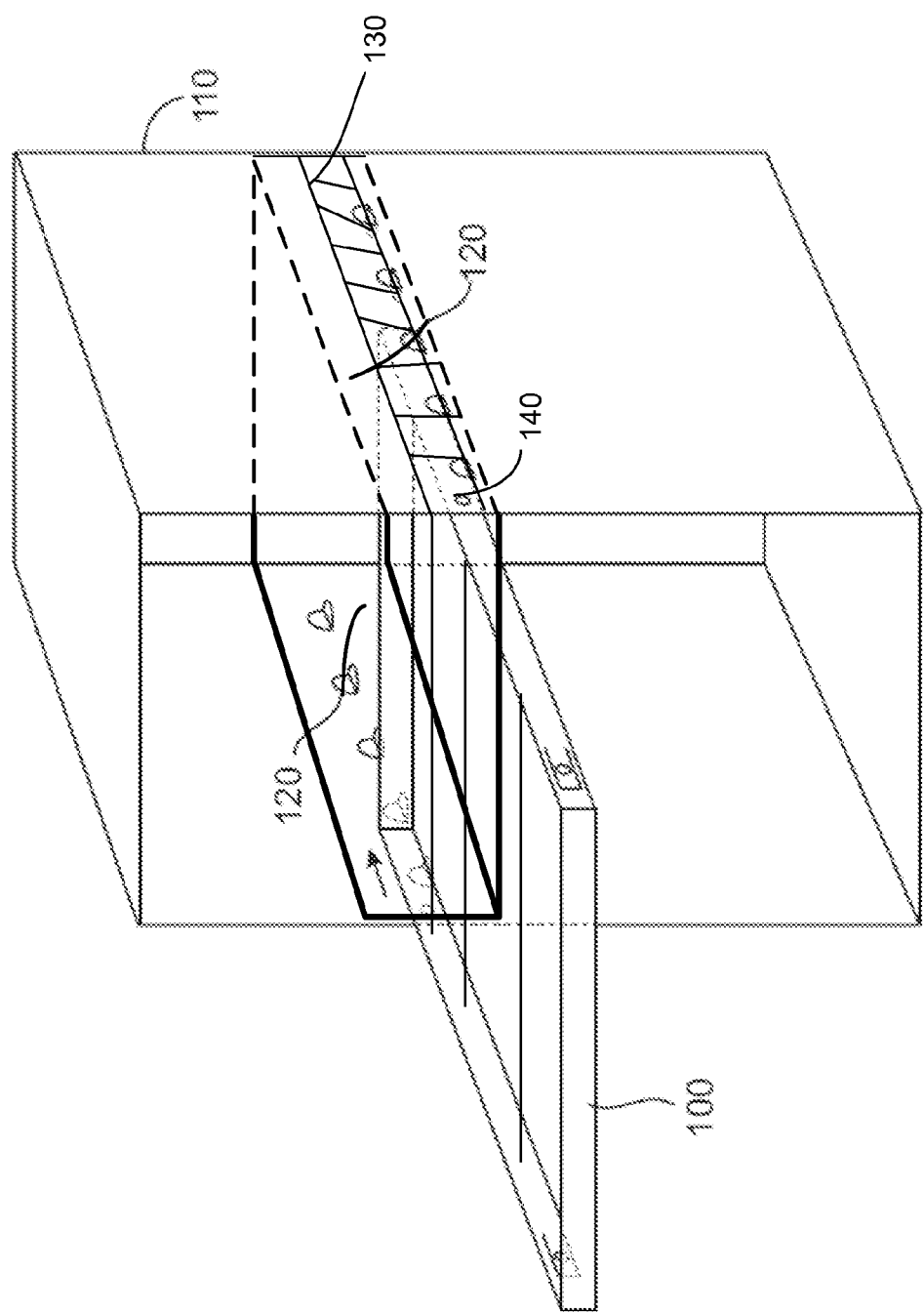
FIG. 1 is perspective view of a chassis, according to one embodiment of the invention.

FIG. 1 shows an example of a chassis 110 for use in a computer system. In some embodiments, the chassis 110 is a rigid frame made up of a plurality of walls or panels. The chassis 110 may be designed to hold a mother board, memory devices, microprocessors, hard drives and/or other computing equipment or devices. In certain embodiments, the chassis 110 is part of a server, which is a central computer or group of computers dedicated to sending and receiving data from other computers on a network. As shown in FIG. 1, the chassis 110 may have a plurality of walls or panels, such as a base panel, two side panels and a back panel.

Different components, such as hard drives, may be enclosed within a housing 120, which is included within the chassis 110. The housing 120 may be positioned or mounted inside the chassis 110. For example, the housing 120 is inserted into a rack included within the chassis 110. The housing 120 comprises a base panel, a back panel, a top panel, two side panels, and an opening (or "exposed face"). One or more trays 100 are included within the housing 120. For example a tray 100 is included between the two side panels of the housing 120. The tray 100 includes connectors for hard disk drives or other computing resources. In various embodiments, components may be coupled to the tray 100 in a variety of ways. An example of coupling a hard disk drive to the tray 100 is further described in U.S. patent application Ser. No. 13/029,457, filed on Feb. 17, 2011, which is hereby incorporated by reference in its entirety.

A sliding mechanism 130 connects the tray 100 to the housing 120, allowing the tray 100 to move in a direction of motion determined by the location of the sliding mechanism 130. For example, the sliding mechanism 130 is perpendicular to the back panel of the housing 120 and connects an exterior surface of side panels of the tray 100 to an interior surface of the side panels of the housing 120, allowing the tray 100 to move along the side panels of the housing 120. Any suitable sliding mechanism 130 may be used, such as a slide track coupled to the housing 120 with a bearing coupled to the tray 100 and contacting the slide track.

In addition to the sliding mechanism 130, a swivel mechanism 140 also couples the tray 100 to the housing 120. The swivel mechanism 140 may be positioned on the sliding mechanism 130 in a position proximate to the opening of the housing 120, or otherwise coupling the tray 100 to the housing 120. The swivel mechanism 140 allows the tray 100 to be repositioned while remaining connected to the housing 120. Any suitable swivel mechanism 140 may be used, for example a hinge plate coupled to the housing 120 and another hinge plate coupled to the tray 100 with a hinge coupling the hinge plates together.

For example, the tray 120 travels along the sliding mechanism 130 until a portion of the sliding mechanism 130 contacts the swivel mechanism 140. When the portion of the sliding mechanism 130 contacts the swivel mechanism 140, the tray 120 may be pivoted with the swivel mechanism 140 as a pivot point. For example, if the housing 100 is horizontally aligned with the sliding mechanism 130 and swivel mechanism 140 positioned on the side panels, when a portion of the sliding mechanism 130 contacts the swivel mechanism 140, the tray 100 may be moved vertically through a plane perpendicular to the plane including the sliding mechanism 130 and the swivel mechanism. Hence, for the horizontal orientation, the tray 100 may pivot in a downward, or upward, direction using the swivel mechanism 140 as a pivot point. Examples of a swivel mechanism 140 include a hinge, a latch or another suitable fastener for joining the tray 100 to the housing 120. Hence, when the tray 100 is moved along the sliding mechanism 140 so a portion of the tray 100 contacts the swivel mechanism 140, the tray 100 may be pivoted using the swivel mechanism 140 to enable components within the tray 100 to be more easily accessed.

In some embodiments, the housing 120 may be attached to the chassis 110. For example, a pin is located on a side panel of the housing 120 and fits into a slot on the chassis 110. For example, the pin is a small, cylindrical protrusion extending from a panel of the housing 120. The pin may be located at the lower, back end of the housing 120. In another embodiment, there are two pins on the housing 120, each located at the lower, back end on opposing side panels of the housing 120. In other embodiments, the pin may be any type of protrusion, tab, peg, or piece extending from a side of the housing 120. In some embodiments, a plurality of pins may be located at various positions on exterior surfaces of panels of the housing 120.

Figure 2A:
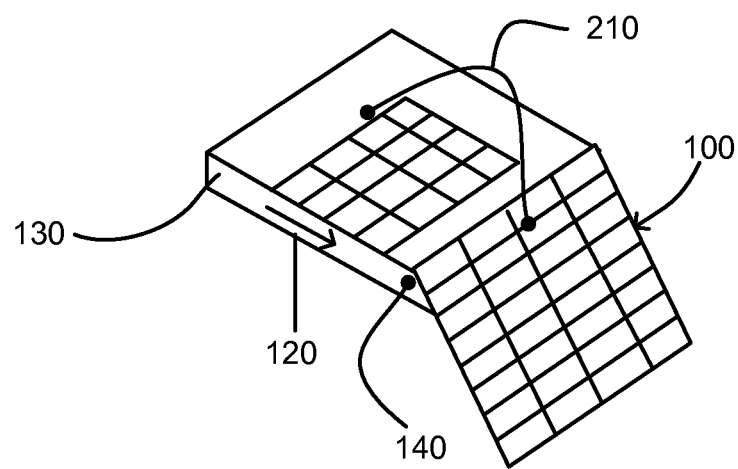
FIG. 2A is a perspective view of a housing and a tray, according to one embodiment of the invention.

FIG. 2A illustrates a perspective view of a tray 100 that has been repositioned using the swivel mechanism 140. In FIG. 2A, a tray 100 has traveled along the sliding mechanism 130 until a portion of the tray 100 contacts the swivel mechanism 140 and the tray 100 has been pivoted in a downward direction using the swivel mechanism 140. As shown in FIG. 2A, the sliding mechanism 130 and the swivel mechanism 140 allow the tray 100 to be pivoted using the sliding mechanism 140 as a pivot point while remaining attached to the housing 120. While FIG. 2A shows a single tray 100 extended from the housing 100, in other embodiments, two or more trays 100 may be included in the housing 120 and may be repositioned using the sliding mechanism 130 and the swivel mechanism 140, or using a sliding mechanism 130 and swivel mechanism 140 associated with the different trays 100.

Also shown in FIG. 2A is a cable 210 coupling the tray 100 to the housing 120. The cable 210 may be used to supply power to the tray 100 and to components stored on the tray 100. For example, the housing 120 is coupled to a power supply via a bus bar, or similar connection to a power supply for a chassis 110 including the housing 120. The cable 210 connecting the tray to the housing 120 allows power from the power supply to be provided to the tray 100. This is further shown below in conjunction with FIG. 2B.

Figure 2B:
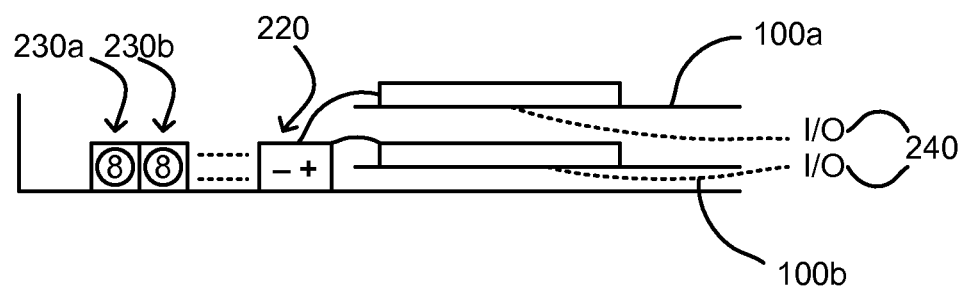
FIG. 2B is a side cross-sectional view of a housing, according to one embodiment of the invention.

FIG. 2B shows a side view of a cross section of a housing 120 coupled to a chassis 110. In the example of FIG. 2B, the housing 120 includes two trays 100a, 100b with cables 210a, 210b connecting each of the trays 100a, 100b to a power source 220. As shown, tray 100a is connected to the power source 220 via cable 210a while tray 100b is connected to the power source 220 via cable 210b. The power source 220 may be a connection from the housing 120 to a power supply of a chassis 110 including the housing 120 or to an external power supply. Additionally, the housing 120 includes fans 230a, 230b to allow cooling of components included in the trays 100a, 100b. In one embodiment, the fans 230a, 230b are oriented into two rows, which may be adjacent to each other. Use of multiple rows of fans 230a, 230b provides redundancy to maintain cooling of components included in the housing 120.

Additionally, each of the trays 100a, 100b includes an input/output (I/O) module 240 for communicating data to and from components coupled to a tray 100. To simplify access to the I/O module 240, it may be positioned at a location on the tray 100 near an opening of the housing 120. Further, an I/O module 240 may be positioned on a surface of the tray 100 that is most readily accessible to a user. For example, if a tray 100 pivots in a downward direction when pivoting around the swivel mechanism 140, the I/O module 240 is included on a downward-facing surface of the tray 100, to increase its accessibility.

Figure 3A:
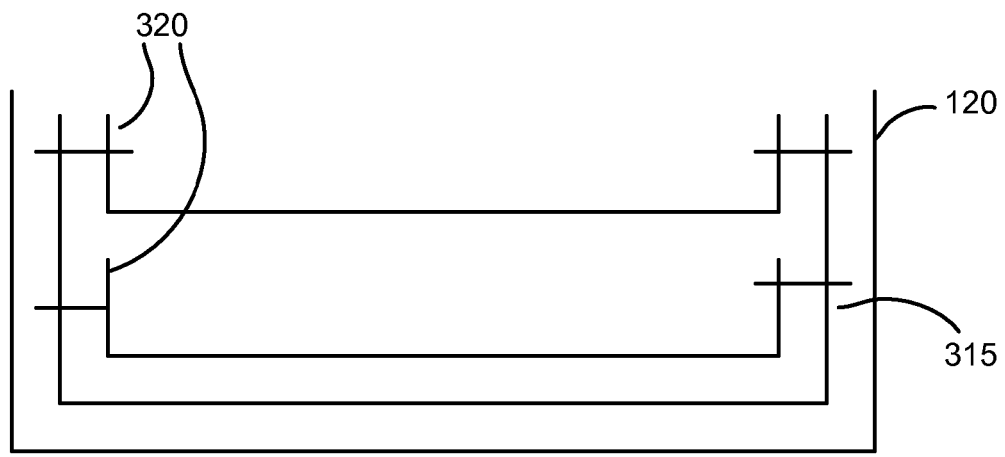
FIG. 3A is a front view of a housing including a sub-tray according to an alternative embodiment of the invention

FIG. 3A illustrates a front view of an alternative embodiment, where the housing 120 includes a sub-tray 315 and one or more component trays 320. A sliding mechanism 130 couples the sub-tray 315 to the housing 120. For example, the sliding mechanism 130 couples an exterior surface of a side panel of the sub tray 315 to an interior surface of a side panel of the housing 120. This allows the sub-tray 315 to be moved along the sliding mechanism 130 so that at least a portion of the sub-tray 315 is outside of the housing 120. Components such as fans, a secondary power distribution board, a controller or other components for operating hard drives, or other components, attached to a component tray 320 are coupled to the sub-tray 315. Because the sliding mechanism 130 allows the sub-tray 315 to be repositioned, components coupled to the sub-tray 315 are more easily accessible. For example, the sliding mechanism 315 allows the sub-tray 315 to be extended out of an opening of the housing 120, allowing access to components coupled to the sub-tray 315 for servicing and/or replacement.

Component trays 320 may be coupled to the sub-tray 315 using a swivel mechanism 140 and/or a sliding mechanism 130, allowing a component tray 320 to be repositioned relative to the sub-tray 315. For example, a swivel mechanism 140 couples the sub-tray 315 to a component tray 320, allowing the component tray 320 to be pivoted about a pivot point determined by the swivel mechanism 140. For example, the swivel mechanism 140 allows a component tray 320 to pivot in a downward direction relative to the sub-tray 315 about the swivel mechanism 140.

Figure 3B:
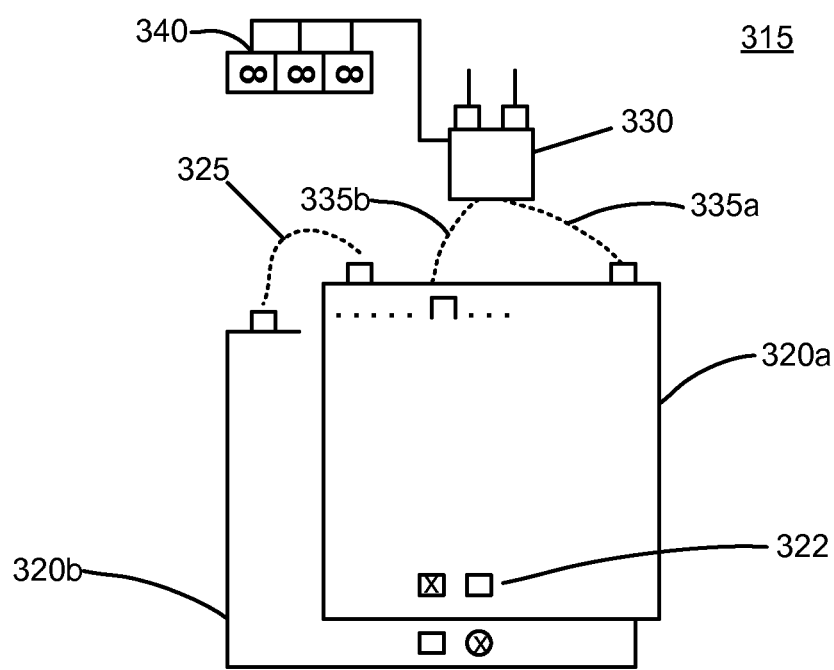
FIG. 3B is a top view of a sub-tray, according to an alternative embodiment of the invention.

FIG. 3B shows an embodiment of components included on a sub-tray 315. In the example of FIG. 3B, the sub-tray 315 includes two component trays 320a, 320b, a power distribution board 330 and fans 340. However, in other embodiments, the sub-tray 315 may include different and/or additional components. For purposes of illustration, FIG. 3B describes the component trays 320a, 320b in an embodiment where they are configured to be coupled to one or more hard disk drives; however, in other embodiments, different and/or additional computing resources may be coupled to the component trays 320a, 320b.

As shown in FIG. 3B, each component tray 320a, 320b includes one or more expander chips 322. Each hard drive coupled to a component tray 320a is coupled to the one or more expander ships 322 included on the component tray 320a, allowing a server or other computing device to access multiple hard drives coupled to the component tray 320a as a single unit. Thus, rather than have separate input/output connections to each hard drive coupled to a component tray 320a, a connection to an expander chip 322 allows a server to access multiple hard drives coupled to a component tray 320a. Further, in FIG. 3B the component trays 320a, 320b are coupled to each other via a connector 325, allowing a server or other computing device to access one, or both, of the component trays 320a, 320b if an expander chip 322 on one of the component trays 320a, 320b fails. Hence, the connector 325 provides increased fail-over redundancy if one or more of the expander chips 322 fails.

In some embodiments, a controller chip is included on the sub-tray 315 and is coupled to the expander chip 322 included on each component tray 320a, 320b. A server or another computing device is coupled to the controller chip, so that the controller chip is the interface between the expander chip 322, which accesses hard drives coupled to a component tray 320a, and the server or other computing device.

The sub-tray 315 also includes a power distribution board 330, which is coupled to a power source, to distribute power among components on the sub-tray 315. For example, the power distribution board 330 is coupled to a power supply of a chassis to which the housing 120 is attached via one or more bus bars. Power from the chassis power supply is distributed among components on the sub-tray, including components on the component trays 320a, 320b, by the power distribution board 330. A power connector 335a couples the power distribution board 330 to a sub-tray 320a while another power connector 335a coupled the power distribution board 330 to the other sub-tray 330b included in the sub-tray 315. One or more fans 340, coupled to the sub-tray 315, are also coupled to the power distribution board 330 and use power from the power distribution board 330 to cool hard drives coupled to the component trays 320a, 320b and other components coupled to the sub-tray 315.

SUMMARY

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. An apparatus comprising:
a housing adapted to be mounted in a chassis including a rack; and
a sub-tray included within the housing and coupled to the housing by a sliding mechanism so that the sub-tray is movable along the sliding mechanism, the sub tray including:
a component tray and a second component tray configured for coupling to one or more computing resources;
a power distribution board coupled to a power supply and to the second compartment tray;
the power distribution board configured to provide power to the one or more computing resources;
a swivel mechanism coupled to the sub-tray and to the component tray, the component tray rotatable using the swivel mechanism as a pivot; and
a second swivel mechanism coupled to the sub-tray and to the second component tray, the second component tray rotatable using the second swivel mechanism as a pivot.

2. The apparatus of claim 1, wherein the swivel mechanism comprises a hinge plate coupled to an interior surface of the housing and a hinge plate coupled to an exterior surface of the sub-tray, a hinge coupling the hinge plates to each other.

3. The apparatus of claim 1, wherein the housing has a horizontal orientation and the swivel mechanism is configured so that the sub-tray pivots about the swivel mechanism in a vertical direction.

4. The apparatus of claim 1, wherein the power supply is an external power supply.

5. The apparatus of claim 1, wherein the apparatus further comprises:
a plurality of fans coupled to the housing.

6. The apparatus of claim 5, wherein the plurality of fans are arranged in a plurality of rows.

7. The apparatus of claim 1, wherein the component tray and the second component tray are coupled together by a connector, the connector configured to communicate data between the component tray and the second component tray.

8. The apparatus of claim 1, wherein one or more fans are coupled to the sub-tray and receive power from the power distribution board.

9. The apparatus of claim 1, wherein the swivel mechanism is configured so that the component tray pivots about the swivel mechanism in a direction orthogonal to a direction in which the sub-tray moves along the sliding mechanism.

10. The apparatus of claim 1, wherein the sliding mechanism comprises a slide track coupled to an interior surface of the housing and a bearing coupled to an interior surface of the sub-tray, the bearing contacting the slide track.

11. The apparatus of claim 1, wherein the housing comprises an exposed face when the housing is mounted to the rack, the sub-tray configured to move along the sliding mechanism through the exposed face of the housing and the component tray configured to pivot using the swivel mechanism so a top surface of the component tray moves in a direction towards a plane including the front face of the housing.

12. The apparatus of claim 1, wherein the one or more computing resources comprise one or more hard disk drives.

13. A system comprising:
- a rack;
- a housing configured to be mounted to the rack;
- a sub-tray included within the housing and coupled to the housing by a sliding mechanism so that the sub-tray is movable along the sliding mechanism, the sub-tray including:
  - a component tray and a second component tray configured for coupling to one or more computing resources;
  - a power distribution board coupled to a power supply and to the second compartment tray;
  - the power distribution board configured to provide power to the one or more computing resources;
  - a swivel mechanism coupled to the sub-tray and to the tray is component tray, the component tray rotatable using the swivel mechanism as a pivot; and
  - a second swivel mechanism coupled to the sub-tray and to the second component tray, the second component tray rotatable using the second swivel mechanism as a pivot.

14. The system of claim 13, wherein the sub-tray is coupled to one or more from the group consisting of: one or more fans, a power distribution board, a controller chip and one or more hard disk drives.

15. The system of claim 13, wherein the component tray and the second component tray are coupled together by a connector, the connector configured to communicate data between the component tray and the second component tray.

16. The system of claim 13, wherein one or more fans are coupled to the sub-tray and receive power from the power distribution board.

17. The system of claim 13, wherein the swivel mechanism is configured so that the component tray pivots about the swivel mechanism in a direction orthogonal to a direction in which the sub-tray moves along the sliding mechanism.

18. The system of claim 13, wherein the sliding mechanism comprises a slide track coupled to an interior surface of the housing and a bearing coupled to an interior surface of the sub-tray, the bearing contacting the slide track.

19. The system of claim 13, wherein the housing comprises an exposed face when the housing is mounted to the rack, the sub-tray configured to move along the sliding mechanism through the exposed face of the housing and the component tray configured to pivot using the swivel mechanism so a top surface of the component tray moves in a direction towards a plane including the front face of the housing.

20. The system of claim 13, wherein the one or more computing resources comprise one or more hard disk drives.

\* \* \* \* \*